United States Patent [19]

Ronen

[11] 3,837,071

[45] Sept. 24, 1974

[54] METHOD OF SIMULTANEOUSLY MAKING A SIGFET AND A MOSFET

[75] Inventor: Ram Shaul Ronen, Kendall Park, N.J.

[73] Assignee: RCA Corporation, New York, N.Y.

[22] Filed: Jan. 16, 1973

[21] Appl. No.: 324,180

[52] U.S. Cl. ...................................... 29/571, 29/578
[51] Int. Cl. ................................................ B01j 17/00
[58] Field of Search ................. 29/571, 576 IW, 578

[56] References Cited

UNITED STATES PATENTS

| | | | |
|---|---|---|---|
| 3,423,651 | 1/1969 | Legat | 29/576 IW |
| 3,604,107 | 9/1971 | Fassett | 29/571 |
| 3,673,679 | 7/1972 | Carbajal | 29/571 |

*Primary Examiner*—Roy Lake
*Assistant Examiner*—W. Tupman
*Attorney, Agent, or Firm*—H. Christoffersen; A. I. Spechler

[57] ABSTRACT

A method comprising providing a gate electrode layer of polycrystalline silicon for a SIGFET, depositing a layer of silicon dioxide doped with an impurity of opposite conductivity type on the gate electrode layer and on the surface of the single crystal layer except where the channel of a MOSFET is to be located, diffusing dopant from the doped oxide layer into the gate electrode layer, and into the single crystal layer to form source and drain regions of the transistors, depositing a layer of gate insulating material on the channel region of the MOSFET, and depositing metal on the source and drain regions and on the gates of both transistors.

8 Claims, 18 Drawing Figures

METHOD OF SIMULTANEOUSLY MAKING A SIGFET AND A MOSFET

The invention herein described was made in the course of or under a contract with the Department of the Air Force.

BACKGROUND OF THE INVENTION

Certain types of integrated circuits, such as depletion load switch amplifiers, require both depletion type and enhancement type field effect unipolar transistors for optimum properties such as high gain, high speed and low power requirements. Depletion type and enhancement type field effect transistors are both well known and are readily made by separate processing. However, in the past, it has been difficult to make both of these types of devices simultaneously using essentially the same processing steps.

Another application where it is desirable to simultaneously fabricate both depletion and enhancement type field effect transistors is in making multi-phase charge-coupled devices and so-called "bucket brigade" type devices. It is advantageous to be able to make both of these types of devices, together with their peripheral associated circuitry, all on the same semiconductor chip.

In the present invention, simultaneous fabrication of depletion and enhancement type FET's is accomplished by a method which includes providing the depletion mode FET with a conventional metal gate electrode and the enhancement mode FET with a highly doped polycrystalline semiconductor gate electrode.

THE DRAWING

FIGS. 1–8 are cross-section views illustrating successive steps in carrying out one embodiment of the method of the invention, and FIGS. 9–18 are similar views illustrating successive steps in carrying out another embodiment of the method of the invention.

DESCRIPTION OF PREFERRED EMBODIMENTS

EXAMPLE 1

Figure 1:
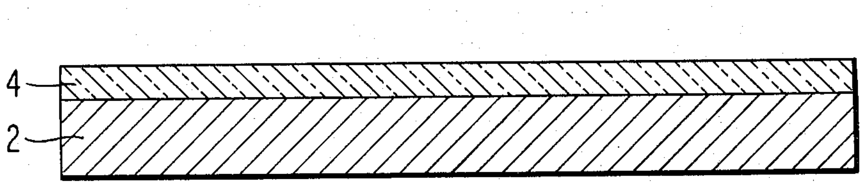

Although the invention may be practiced using either N type or P type starting material, in this Example, a chip of N type silicon single crystal semiconductor material 2 (FIG. 1) is coated with a relatively thick layer 4 of silicon dioxide. The layer of silicon dioxide 4 may be about 1.5 microns thick, for example, and may be deposited by thermal growth in a steam atmosphere. In these Examples the term "deposited" will be assumed to include the growth type of process in which oxygen unites with silicon in the substrate to produce an oxide. The relatively thick layer of oxide 4 is desirable to carry conductors and other circuit parts that can be deposited by evaporation. The thickness of this layer also prevents diffusion of impurities into the substrate in areas where such is not desired, as will be explained later.

Figure 2:
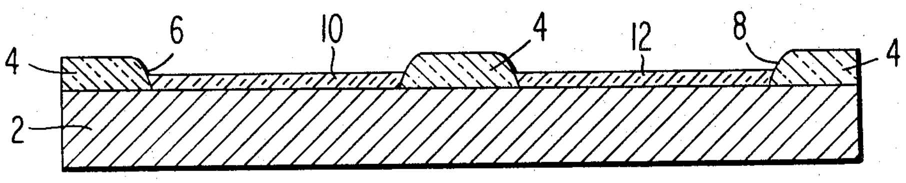

The layer 4 of silicon dioxide is then removed in areas where it is desired to place transistors (FIG. 2). This is done by covering the layer 4 of oxide with a conventional photoresist (not shown), exposing to a master pattern (not shown), and developing to remove portions of the photoresist not exposed to light (if the photoresist is of the negative type). The uncovered parts of the oxide layer 4 are then etched away with buffered HF to form openings 6 and 8. Thin layers 10 and 12 of $SiO_2$ about 1,000 A thick, are then deposited within the openings 6 and 8 respectively, on the surface of the substrate 2. This also may be done by the thermal growth process. Although the layer 12 serves no functional purpose, it is usually easier to let it grow than to mask the surface and prevent its growth since it will be removed anyway in a subsequent step.

Figure 3:
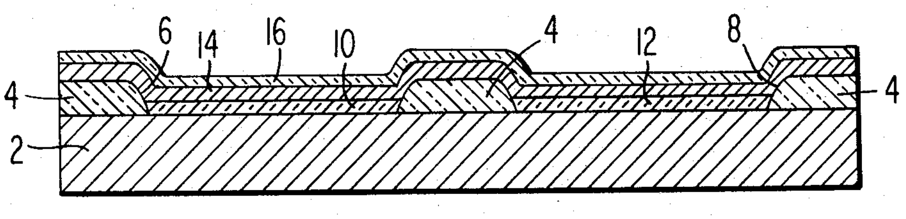

Next (FIG. 3) a layer 14 of polysilicon having a thickness of about 0.5 to 1.0 $\mu$m, is deposited over the entire face of the chip. Although this layer may be doped, in this Example it is left undoped. The layer may be deposited by pyrolysis of $SiH_4$ with the substrate heated to about 800° C. Then a layer 16 of silicon dioxide about 3,000-5,000 A thick, is deposited over the entire top surface of the polysilicon layer 14. The oxide layer 16 is thick enough to serve as a masking layer when the polysilicon layer 14 is subsequently etched but thin enough to be etched away completely when the bottom layer of silicon dioxide 10 is etched away.

Figure 4:
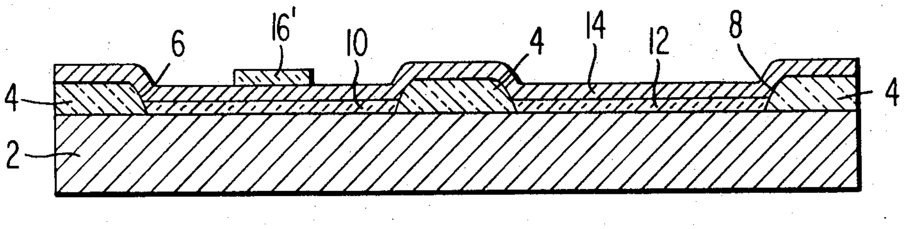

Then, as shown in FIG. 4, all of the layer 16 of silicon dioxide is removed except an island area 16' within the opening 6 where the gate of the SIGFET is to be located. This may be done by conventional masking with a photoresist, exposure through a master, developing the photoresist and etching the $SiO_2$ with buffered HF. The photoresist layer (not shown) on top of the oxide island 16' is removed before subsequent processing is begun.

Figure 5:
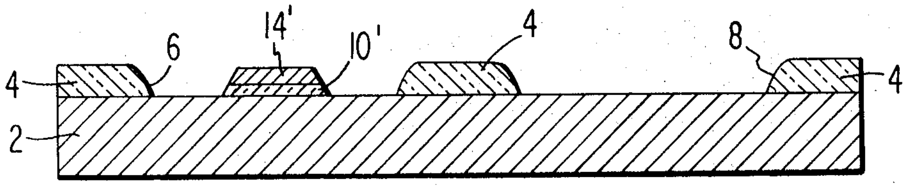

The area of silicon dioxide 16' serves as a mask for etching the layer of polysilicon 14. The layer 14 is etched using KOH buffered with acetic acid or it may be etched with a combination of hydrofluoric and nitric acids. This leaves an isolated area 14' of polysilicon (FIG. 5).

The lower layers 10 and 12 of silicon dioxide are then etched with buffered HF leaving an isolated area 10' of silicon dioxide beneath the area 14' of polysilicon. During this step, the top layer isolated area 16' of oxide is also etched away.

Figure 6:
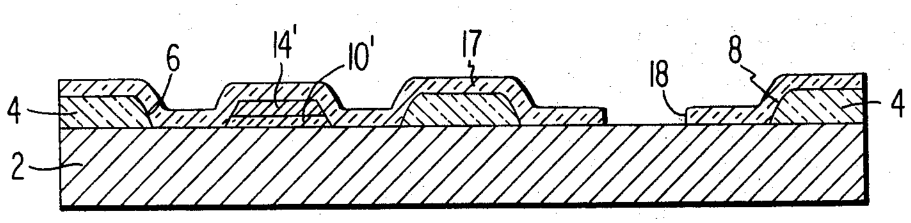

Next (FIG. 6) a layer 17 of silicon dioxide heavily doped with boron oxide is deposited over the entire face of the chip except for an opening 18 where the channel of the MOSFET is to be located. This may be done by reacting silicon hydride ($SIH_4$) and diborane ($B_2H_6$) in the presence of oxygen, at 200°–450° C. The boron doped oxide is actually a borosilicate glass. To form the opening 18, the entire area may first be covered with the doped oxide layer 17. This layer may then be covered with a thin layer of undoped oxide (not shown) and the undoped oxide covered with a layer of photoresist (not shown). The layer of undoped oxide is needed because photoresists do not adhere well to the doped oxide (boroxilicate glass). The photoresist layer is exposed and developed. Then, in conventional manner, the doped oxide layer 17 is etched with buffered HF to form the opening 18.

Figure 7:
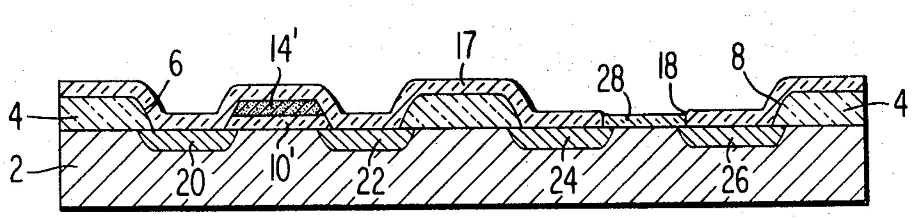

The dopant in the doped oxide layer 17 is then diffused into the chip 2 wherever the layer 17 and the chip 2 are in contact, to form P+ type doped regions 20, 22, 24 and 26 (FIG. 7). The regions 20 and 22 will be the source and drain regions of a SIGFET and the regions 24 and 26 will become the source and drain regions of a MOSFET. Dopant from the layer 17 also diffuses into the polycrystalline layer portion 14' and makes it more conductive. The diffusing step is carried out by heating the assembly in an inert atmosphere, such as helium or nitrogen, at a temperature of about 1,000°–1,050° C for 15 minutes. The portions of relatively thick undoped oxide layer 4 surrounding the openings 6 and 8 prevent the diffusion of impurities from doped oxide layer 17 into parts of the chip 2 where doping is unwanted.

The assembly is then heated in an oxygen atmosphere to grow a silicon dioxide layer 28 about 1,000 A thick, within the opening 18. The layer 28 becomes the gate insulator layer of the MOSFET. After this step, the devices may be annealed at 1,050° C to drive the dopant deeper into the chip 2, if desired, and this may be followed with a low temperature anneal at 500° C in hydrogen.

Figure 8:
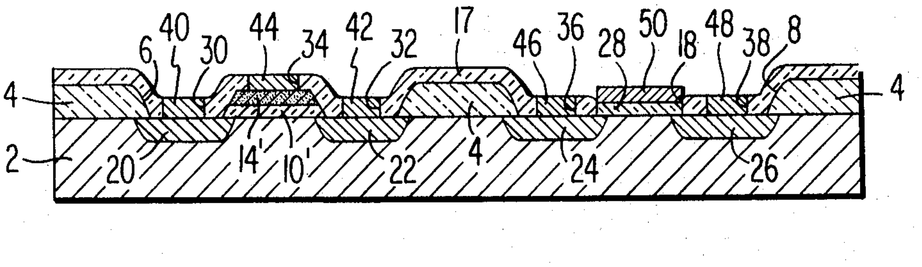

In order to complete the devices, openings are made in the doped oxide layer 17 and a layer of metal is deposited within each opening to make ohmic connections to the source and drain regions and also to form gate electrodes. As shown in FIG. 8, an opening 30 is made over source region 20 of the SIGFET and a layer of aluminum 40 is deposited on the chip surface within the opening. An opening 32 is made over drain region 22 of the SIGFET and a layer of aluminum 42 is deposited within the opening. An opening 34 is made over gate electrode 14' of the SIGFET and a layer of aluminum 44 is deposited on the electrode 14' to make an ohmic connection thereto. An opening 36 is made over drain region 24 of the MOSFET and a layer of aluminum 46 is deposited within the opening. An opening 38 is made over source region 26 of the MOSFET and a layer of aluminum 48 is deposited within the opening. And a layer of aluminum 50 is deposited on top of gate electrode of the MOSFET.

Thus, a depletion type SIGFET and an enhancement type MOSFET can be made simultaneously, side-by-side on the same semiconductor chip.

The general principles of the invention can also be applied to simultaneously making a SIGFET and a MOSFET using SOS (silicon-on-sapphire) techniques, as described in the following example.

EXAMPLE 2

Figure 9:
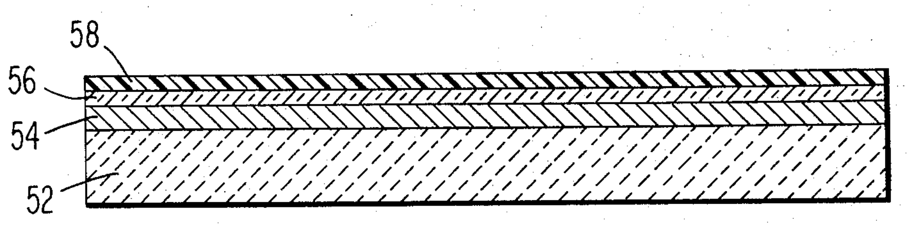
Figure 10:
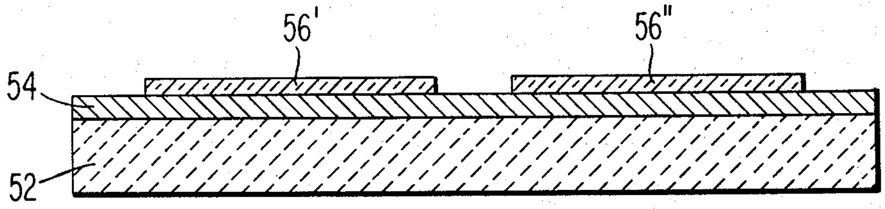
Figure 11:
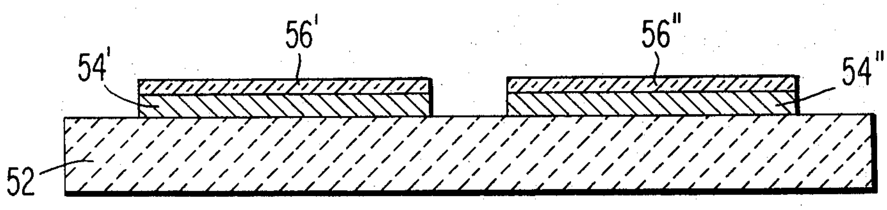
Figure 12:
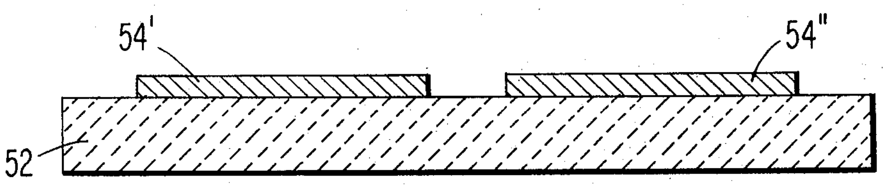

Separate islands of semiconductor are formed by using a wafer 52 of single crystal sapphire (or magnesium aluminate spinel) as a substrate (FIG. 9), and growing an N type epitaxial layer 54 of silicon on the top surface of the wafer. The epitaxial layer 54 is covered with a masking layer 56 of silicon dioxide and a layer 58 of photoresist. By conventional masking, exposing and developing techniques, separate islands 56' and 56'' of silicon dioxide are delineated on the epitaxial layer 54 (FIG. 10). These islands 56' and 56'' are then used as masks to define separate areas or islands of silicon 54' and 54'' (FIG. 11) and the silicon dioxide islands 56' and 56'' are then removed (FIG. 12).

Figure 13:
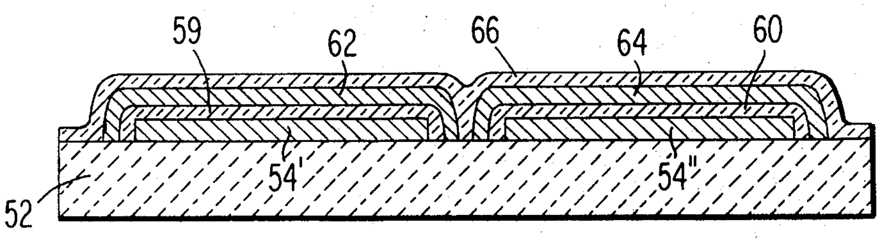

Next (FIG. 13), in order to delineate the gate of a SIGFET device, layers 59 and 60 of silicon dioxide are deposited on the silicon islands 54' and 54'', respectively. Layers 62 and 64 of undoped polysilicon are deposited on the silicon dioxide layers 59 and 60, respectively. And another masking layer of silicon dioxide 66 is deposited over the entire top surface of the assembly.

Figure 14:
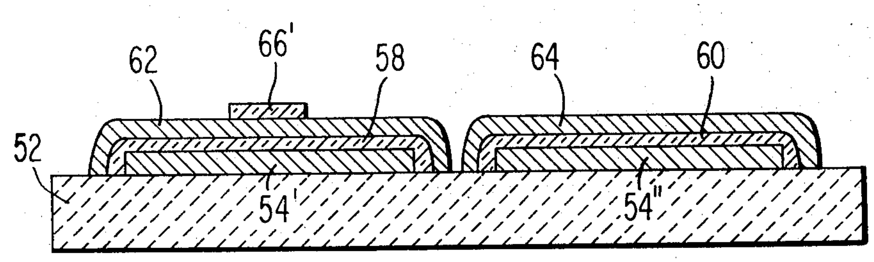
Figure 15:
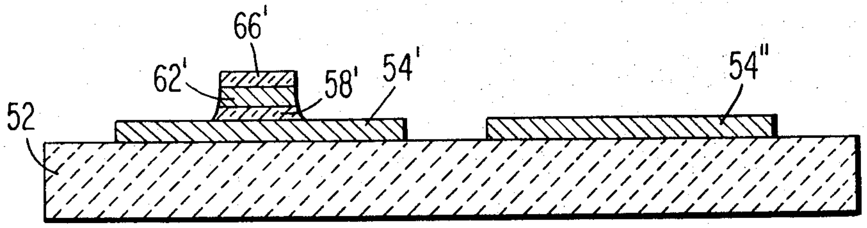

Then (FIG. 14) all of the masking layer 66 of silicon dioxide is removed, except a small island 66' by a conventional masking and etching process. The island 66' of oxide is then used as a mask to define a corresponding island of polysilicon 62' (FIG. 15) which in turn serves as a mask to define a small island of silicon dioxide 59' in the original layer of oxide 59. When the major part of the oxide layer 59 is etched away, the small area of oxide 66' is also removed.

Figure 16:
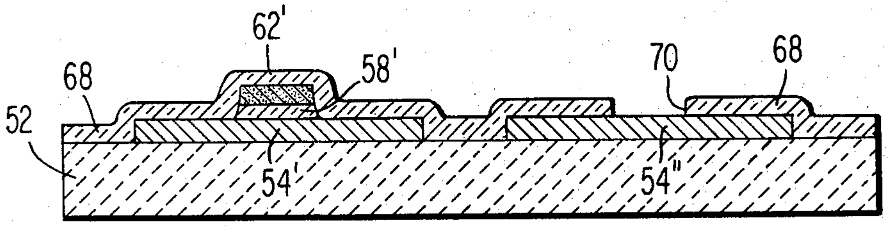

As shown in FIG. 16, a layer of P doped silicon dioxide 68 is then deposited over the entire top surface of the assembly and an opening 70 is made in the layer 68 where the layer covers the silicon island 54''. The opening 70 defines the location of the gate and channel of the MOSFET. As in the previous example, the oxide layer 68 may be doped with boron introduced as $B_2O_3$.

Figure 17:
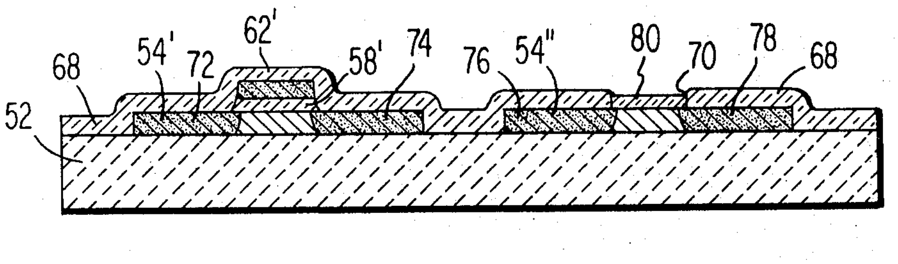

Also, as in the previous example, the assembly is then heated to a temperature sufficient to drive dopant from the oxide layer 68 into the silicon layer 54' to form P+ diffused regions 72 and 74 (FIG. 17) which will function as source and drain regions of the SIGFET. At the same time, dopant from another part of the layer 68 diffuses into the silicon island 54'' to form P+ source and drain regions 76 and 78 of the MOSFET. Also, dopant from that part of the doped oxide layer 68 overlying the polysilicon layer portion 62' diffuses into that portion and forms a highly doped gate electrode for the SIGFET.

A gate dielectric layer for the MOSFET is formed by depositing a layer 80 of silicon dioxide within the opening 70 which is over the channel region of the MOSFET.

Figure 18:
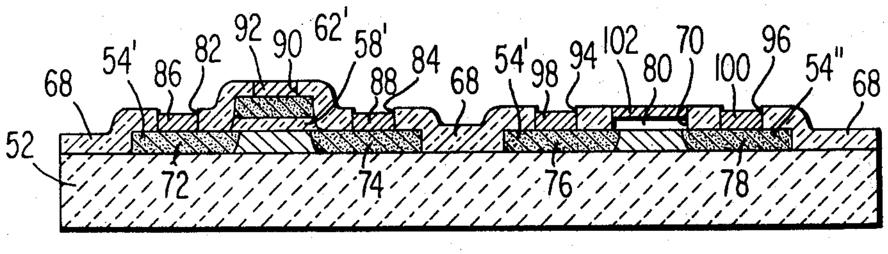

Metal electrode connections are then made to the transistors by etching openings in the layer 68 (FIG. 18) and depositing aluminum in these openings by evaporation. Aluminum is first deposited over-all and then the aluminum is removed by photomasking and etching from all parts except where the electrode connections are desired. Source and drain electrodes 86 and 88 of the SIGFET are deposited within openings 82 and 84 respectively. Gate electrode connection 92 of the SIGFET is deposited within opening 90. Source and drain electrodes 98 and 100 of the MOSFET are deposited within openings 94 and 96, respectively. And a gate electrode 102 of the MOSFET is deposited on gate dielectric layer 80.

I claim:

1. A method of simultaneously fabricating a SIGFET and a MOSFET, each with the same conductivity type channel, on a semiconductor single crystalline layer comprising the following steps, in the order named:

providing a layer of single crystal semiconductor material of one conductivity type having a surface, depositing a layer of insulating material on a portion of said surface to serve as the gate insulating layer of said SIGFET, depositing a layer of polycrystalline silicon over said layer of insulating material, depositing a layer of silicon dioxide doped with an impurity of opposite conductivity type over said polycrystalline silicon and also over portions of said single crystal surface which are to become the source and drain regions of said transistors, except where the channel of said MOSFET is to be located, heating to diffuse dopant from said doped oxide layer into those portions of said single crystal layer in contact with said doped oxide layer to form source and drain regions of said transistors, and also into said polycrystalline layer, depositing a layer of gate insulating material onto the area of said single crystal layer between said source and drain regions of said MOSFET, and providing metal electrode layers on said source and drain regions and on the gate regions of both transistors.

2. A method according to claim 1 in which said semiconductor crystalline layer is a single chip of material.

3. A method according to claim 1 in which said semiconductor crystalline layer comprises a plurality of discrete epitaxial portions on an insulating substrate.

4. A method according to claim 1 in which said layer of insulating material is silicon dioxide.

5. A method according to claim 1 in which said polycrystalline silicon layer is deposited so as to completely cover said surface and then most of said polycrystalline layer is removed to leave only that portion thereof over said gate insulating layer.

6. A method according to claim 1 in which said semiconductor single crystalline layer is N type and said doped silicon dioxide layer is doped P type.

7. A method according to claim 1 in which said heating is done in an oxidizing ambient and said MOSFET gate insulating material is deposited during the diffusion step.

8. A method according to claim 1 in which said metal electrode layers comprise aluminum.

* * * * *